United States Patent
Moriyama et al.

(10) Patent No.: US 10,312,125 B2
(45) Date of Patent: Jun. 4, 2019

(54) PROTECTIVE TAPE AND METHOD FOR MANUFACTURING SEMICONDUCTOR DEVICE USING THE SAME

(71) Applicant: DEXERIALS CORPORATION, Tokyo (JP)

(72) Inventors: Hironobu Moriyama, Tochigi (JP); Hidekazu Yagi, Tochigi (JP); Tomoyuki Ishimatsu, Tochigi (JP); Katsuyuki Ebisawa, Tochigi (JP); Keiji Honjyo, Tochigi (JP); Junichi Kaneko, Tochigi (JP)

(73) Assignee: DEXERIALS CORPORATION, Tokyo (JP)

( * ) Notice: Subject to any disclaimer, the term of this patent is extended or adjusted under 35 U.S.C. 154(b) by 1 day.

(21) Appl. No.: 15/574,729

(22) PCT Filed: Jun. 3, 2016

(86) PCT No.: PCT/JP2016/066547
§ 371 (c)(1),
(2) Date: Nov. 16, 2017

(87) PCT Pub. No.: WO2016/195061
PCT Pub. Date: Dec. 8, 2016

(65) Prior Publication Data
US 2018/0151405 A1    May 31, 2018

(30) Foreign Application Priority Data
Jun. 4, 2015 (JP) .................................. 2015-114338

(51) Int. Cl.
*C09J 7/24* (2018.01)
*C09J 7/25* (2018.01)
(Continued)

(52) U.S. Cl.
CPC .......... *H01L 21/6836* (2013.01); *B32B 27/00* (2013.01); *B32B 27/08* (2013.01);
(Continued)

(58) Field of Classification Search
CPC ... H01L 21/6836; H01L 21/78; H01L 23/562; H01L 24/11
See application file for complete search history.

(56) References Cited

U.S. PATENT DOCUMENTS

| 2003/0064579 A1* | 4/2003 | Miyakawa | ................. C09J 7/29 |
| | | | 438/628 |
| 2005/0008873 A1* | 1/2005 | Noro | ....................... B32B 27/08 |
| | | | 428/423.1 |

(Continued)

FOREIGN PATENT DOCUMENTS

| JP | 2003-173994 A | 6/2003 |
| JP | 2005-028734 A | 2/2005 |

(Continued)

OTHER PUBLICATIONS

Jul. 19, 2016 Search Report issued in International Patent Application No. PCT/JP2016/066547.

*Primary Examiner* — Erik T. K. Peterson
*Assistant Examiner* — Farid H Khan
(74) *Attorney, Agent, or Firm* — Oliff PLC

(57) ABSTRACT

A protective tape that improves solder bonding properties and reduces wafer warping. The protective tape includes, in the following order, an adhesive agent layer, a first thermoplastic resin layer, a second thermoplastic resin layer, and a matrix film layer. The protective tape satisfies the conditions expressed by the following formulae (1) to (3):

$$Ga > Gb \quad (1)$$

$$Ta < Tb \quad (2)$$

$$(Ga*Ta+Gb*Tb)/(Ta+Tb) \leq 1.4\text{E}+06 \text{ Pa.} \quad (3)$$

Ga represents a shear storage modulus of the first thermoplastic resin layer at a pasting temperature at which the (Continued)

protective tape is pasted; Gb represents a shear storage modulus of the second thermoplastic resin layer at the pasting temperature at which the protective tape is pasted; Ta represents a thickness of the first thermoplastic resin layer; and Tb represents a thickness of the second thermoplastic resin layer.

20 Claims, 5 Drawing Sheets

(51) Int. Cl.
    *C09J 7/29* (2018.01)
    *C09J 7/38* (2018.01)
    *B32B 27/00* (2006.01)
    *B32B 27/08* (2006.01)
    *B32B 38/10* (2006.01)
    *H01L 21/78* (2006.01)
    *H01L 23/00* (2006.01)
    *C09J 163/00* (2006.01)
    *C09J 163/04* (2006.01)
    *H01L 21/304* (2006.01)
    *H01L 21/683* (2006.01)

(52) U.S. Cl.
CPC .............. *B32B 38/10* (2013.01); *C09J 7/245* (2018.01); *C09J 7/255* (2018.01); *C09J 7/29* (2018.01); *C09J 7/38* (2018.01); *C09J 163/04* (2013.01); *H01L 21/304* (2013.01); *H01L 21/78* (2013.01); *H01L 23/562* (2013.01); *H01L 24/11* (2013.01); *B32B 2405/00* (2013.01); *C09J 163/00* (2013.01); *C09J 2201/162* (2013.01); *C09J 2203/326* (2013.01); *C09J 2205/114* (2013.01); *C09J 2423/046* (2013.01); *C09J 2431/006* (2013.01); *C09J 2463/00* (2013.01); *C09J 2467/006* (2013.01); *H01L 2221/6834* (2013.01); *H01L 2221/68327* (2013.01); *H01L 2221/68386* (2013.01); *H01L 2224/11009* (2013.01)

(56) References Cited

U.S. PATENT DOCUMENTS

| | | | | |
|---|---|---|---|---|
| 2008/0131634 | A1* | 6/2008 | Kiuchi | B32B 1/08 428/34.9 |
| 2011/0048615 | A1* | 3/2011 | Fukaya | H01L 21/6836 156/154 |
| 2012/0208350 | A1* | 8/2012 | Oda | H01L 21/568 438/465 |
| 2012/0273975 | A1* | 11/2012 | Hayashishita | H01L 21/67132 257/790 |

FOREIGN PATENT DOCUMENTS

| | | |
|---|---|---|
| JP | 2006-128292 A | 5/2006 |
| JP | 2012-169482 A | 9/2012 |
| WO | 2006/118033 A1 | 11/2006 |
| WO | 2012/026431 A1 | 3/2012 |

* cited by examiner

PROTECTIVE TAPE AND METHOD FOR MANUFACTURING SEMICONDUCTOR DEVICE USING THE SAME

TECHNICAL FIELD

The present disclosure relates to a protective tape used in manufacturing semiconductor devices and also relates to a method for manufacturing a semiconductor device using the same. This application claims priority to Japanese Patent Application No. 2015-114338 filed on Jun. 4, 2015, the entire content of which is hereby incorporated by reference.

BACKGROUND ART

Conventional post-processing in manufacturing processes of flip-chip mounting semiconductors is performed in the following manner. First, to a bump formation surface of a wafer on which a plurality of bumps (protruding electrodes) are formed, an adhesive sheet or tape, known as back grind tape, is pasted to protect the bumps; in this configuration, a side opposite to the bump electrode formation surface is ground to a predetermined thickness (for example, see PLT 1 to 3). After completing the grinding, the backgrind tape is peeled and the wafer is diced to obtain individual semiconductor chips. Next, the semiconductor chips are flip-chip mounted onto other semiconductor chips or substrates. Then, an underfill is cured to reinforce the semiconductor chip.

For example, PLT 1 describes a method of using a thermosetting resin layer and a thermoplastic resin layer laminated together as a backgrind tape, and only the thermosetting resin layer is left on the bump formation surface of the wafer and other layers are removed.

CITATION LIST

Patent Literature

PLT 1: Japanese Unexamined Patent Application Publication No. 2005-28734
PLT: 2 International Publication No. 2006/118033
PLT: 3 International Publication No. 2012/026431

SUMMARY OF INVENTION

Technical Problem

With conventional back grind tape, significant wafer warping occurs after backgrinding a wafer, precluding handling in subsequent processes. Moreover, with conventional back grind tape, when leaving only the thermosetting resin layer and removing other layers, resin remains on the bumps which, for example, can impede solder bonding and degrade connection properties during reflow.

The present disclosure has been proposed in view of such conventional circumstances and provides a protective tape and a method for manufacturing a semiconductor device using the same which are capable of improving solder bonding properties and reducing wafer warping.

Solution to Problem

As a result of earnest investigation, the present inventors have found that the aforementioned problems can be solved by a protective tape including, in the following order, an adhesive agent layer, a first thermoplastic resin layer, a second thermoplastic resin layer, and a matrix film layer, in which conditions expressed by formulae (1) to (3) given below are satisfied.

That is, a protective tape according to the present disclosure includes, in the following order, an adhesive layer, a first thermoplastic resin layer, a second thermoplastic resin layer, and a matrix film layer, and satisfies conditions expressed by the following formulae (1) to (3).

$$Ga > Gb \quad (1)$$

$$Ta < Tb \quad (2)$$

$$(Ga*Ta + Gb*Tb)/(Ta + Tb) \leq 1.4E+06 \text{ Pa} \quad (3)$$

In formula (1), Ga represents a shear storage modulus of the first thermoplastic resin layer at a pasting temperature at which the protective tape is pasted and Gb represents a shear storage modulus of the second thermoplastic resin layer at the pasting temperature at which the protective tape is pasted, in formula (2), Ta represents a thickness of the first thermoplastic resin layer and Tb represents a thickness of the second thermoplastic resin layer, in formula (3), Ga and Gb are the same as in formula (1) and Ta and Tb are the same as in formula (2).

Furthermore, a method for manufacturing a semiconductor device according to the present disclosure includes, a protective tape pasting step of pasting a protective tape having an adhesive agent layer to a wafer surface on which a bump is formed, a grinding step of grinding a surface of the wafer opposite to the side on which the protective tape is pasted, and a protective tape peeling step of peeling the protective tape so that the adhesive agent layer remains and other layers are removed; the protective tape includes, in the following order, the adhesive agent layer, a first thermoplastic resin layer, a second thermoplastic resin layer, and a matrix film layer, in which conditions expressed by formulae (1) to (3) given above are satisfied.

Moreover, a semiconductor device according to the present disclosure is manufactured by the method for manufacturing a semiconductor device.

Advantageous Effects of Invention

A protective tape includes, in the following order, an adhesive agent layer, a first thermoplastic resin layer, a second thermoplastic resin layer, and a matrix film layer; by satisfying conditions expressed by Formulae (1) to (3), when removing layers (the first thermoplastic resin layer and the second thermoplastic resin layer) other than the adhesive agent layer from the protective tape, which is pasted via the adhesive agent layer to a wafer on which bumps are formed, because the likelihood of the adhesive agent layer remaining on the bumps is decreased, solder bonding properties can be improved. Furthermore, wafer warping after backgrinding can be reduced by satisfying the conditions expressed by Formulae (1) to (3), because a corrected elastic modulus, in which elastic modulus of the first thermoplastic resin layer and the second thermoplastic resin layer are corrected with thicknesses thereof, is adjusted to be within an appropriate range.

DESCRIPTION OF EMBODIMENTS

Figure 1:
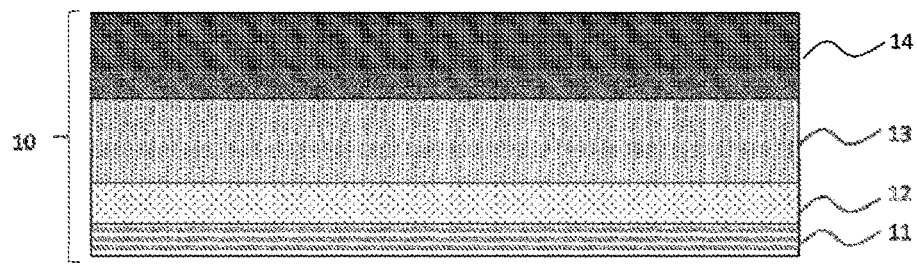
FIG. 1 is a schematic cross-sectional view illustrating a protective tape.

Embodiments of the present disclosure will now be described in detail according to the following order.
1. Protective Tape
2. Method for Manufacturing Semiconductor Device
3. Examples

1. Protective Tape

A protective tape according to the present embodiment includes, in the following order, an adhesive layer, a first thermoplastic resin layer, a second thermoplastic resin layer, and a matrix film layer, and satisfies conditions expressed by the following formulae (1) to (3).

$$Ga > Gb \tag{1}$$

$$Ta < Tb \tag{2}$$

$$(Ga*Ta + Gb*Tb)/(Ta+Tb) \leq 1.4E+06 \text{ Pa} \tag{3}$$

In formula (1), Ga represents a shear storage modulus of the first thermoplastic resin layer at a pasting temperature at which the protective tape is pasted and Gb represents a shear storage modulus of the second thermoplastic resin layer at the pasting temperature at which the protective tape is pasted, in formula (2), Ta represents a thickness of the first thermoplastic resin layer and Tb represents a thickness of the second thermoplastic resin layer, in formula (3), Ga and Gb are the same as in formula (1) and Ta and Tb are the same as in formula (2).

The protective tape satisfies a condition expressed by Formula (1). Thus, the shear storage modulus (Ga) of the first thermoplastic resin layer at the pasting temperature at which the protective tape is pasted is greater than the shear storage modulus (Gb) of the second thermoplastic resin layer at the pasting temperature at which the protective tape is pasted. By satisfying the condition of Formula (1), the first thermoplastic resin layer, which is the layer adjacent to the adhesive agent layer, is harder than the second thermoplastic resin layer when the first thermoplastic resin layer is to be deformed, thus the second thermoplastic resin layer is unlikely to impede deformation of the first thermoplastic resin layer.

Furthermore, the protective tape satisfies a condition expressed by Formula (2). Thus, the thickness (Tb) of the second thermoplastic resin layer is greater than the thickness (Ta) of the first thermoplastic resin layer. By satisfying the conditions of Formula (1) and Formula (2), in the protective tape, the first thermoplastic resin layer, which is harder than the second thermoplastic resin layer, is thinner, and the second thermoplastic resin layer, which is softer than the first thermoplastic resin layer, is thicker.

Furthermore, the protective tape satisfies a condition expressed by Formula (3). Thus, a corrected elastic modulus value, which is an elastic modulus of the first thermoplastic resin layer and the second thermoplastic resin layer corrected with thicknesses thereof, is 1.4E+06 Pa or less. By satisfying the condition of Formula (3), because the corrected elastic modulus is adjusted to be within an appropriate range, wafer warping after backgrinding can be reduced.

The left-hand side value of Formula (3), or the lower limit for the corrected elastic modulus, without particular limitation, is preferably 1.0E+05 Pa or more.

Thus, the protective tape includes, in the following order, the adhesive agent layer, the first thermoplastic resin layer, the second thermoplastic resin layer, and the matrix film layer, by satisfying the conditions expressed by Formulae (1) to (3), when removing layers (the matrix film layer, the first thermoplastic resin layer, and the second thermoplastic resin layer) other than the adhesive agent layer from the protective tape pasted via the adhesive agent layer to a wafer on which bumps are formed, because the likelihood of the adhesive agent layer remaining on the bumps is decreased, solder bonding properties can be improved. Furthermore, wafer warping after backgrinding can be reduced.

In addition to satisfying the conditions of Formulae (1) to (3), the protective tape preferably satisfies a condition expressed by Formula (1A).

$$Ga > Gb > Gn \tag{1A}$$

In Formula (1A), Gn represents the shear storage modulus of the adhesive agent layer at the pasting temperature at which the protective tape is pasted, Ga and Gb being the same as Ga and Gb in Formula (1).

Thus, preferably, the shear storage modulus (Ga) of the first thermoplastic resin layer at the pasting temperature at which the protective tape is pasted is the greatest, the shear storage modulus (Gb) of the second thermoplastic resin layer at the pasting temperature at which the protective tape is pasted is the second greatest, and the shear storage modulus (Gn) of the adhesive agent layer at the pasting temperature at which the protective tape is pasted is the third greatest. By satisfying the condition expressed by Formula (1A), because the adhesive agent layer, the second thermoplastic resin layer, and the first thermoplastic resin layer have increasing hardness in this order, deformation and flow of the adhesive agent layer are much superior in comparison with the first thermoplastic resin layer. Thereby, adhesion of the adhesive agent layer to bumps of the wafer can be more effectively suppressed when pasting the protective tape to the wafer, and because the likelihood of the adhesive agent layer remaining on bumps is decreased, solder bonding properties can be improved.

In addition to satisfying the conditions of Formulae (1) to (3), the protective tape preferably satisfies a condition expressed by Formula (2A).

$$Tn < Ta < Tb \tag{2A}$$

In Formula (2A), Tn represents a thickness of the adhesive agent layer, Ta and Tb being the same as Ta and Tb in Formula (2).

Thus, preferably, the thickness (Tb) of the second thermoplastic resin layer is the greatest, the thickness (Ta) of the first thermoplastic resin layer is the second greatest, and the thickness (Tn) of the adhesive agent layer is the third greatest.

In addition to satisfying the conditions of Formulae (1) to (3), the protective tape preferably satisfies a condition expressed by Formula (4).

$$Gn/Ga \leq 0.01 \quad (4)$$

Thus, a ratio (Gn/Ga) of the shear storage modulus (Gn) of the adhesive agent layer at the pasting temperature at which the protective tape is pasted to the shear storage modulus (Ga) of the first thermoplastic resin layer at the pasting temperature at which the protective tape is pasted is preferably 0.01 or less. By satisfying Formula (4), deformation and flow of the adhesive agent layer are much superior in comparison with the first thermoplastic resin layer. Thereby, adhesion of the adhesive agent layer to bumps of the wafer can be more effectively suppressed when pasting the protective tape to the wafer, and because the likelihood of the adhesive agent layer remaining on bumps is decreased, solder bonding properties can be improved.

The left-hand side value, (Gn/Ga), of Formula (4) has a lower limit of preferably 1.0E+03 or more.

FIG. 1 is a schematic cross-sectional view illustrating a protective tape. A protective tape 10, known as back grind tape, protects a wafer from defects such as scratches, cracks, and contamination in a grinding step. As illustrated in FIG. 1, the protective tape 10 includes, in the following order, an adhesive agent layer 11, a first thermoplastic resin layer 12, a second matrix film layer 13, and a matrix film layer 14.

Adhesive Agent Layer 11

The adhesive agent layer 11 has a shear storage modulus (Gn) at 60□ of preferably 1.0E+01 to 5.0E+04 Pa and more preferably 1.0E+02 to 3.5E+03 Pa. Setting the shear storage modulus of the adhesive agent layer 11 to 1.0E+01 Pa or more can suppress covering of bump tips by the adhesive agent layer due to the adhesive agent layer 11 adhering to bumps when the bumps pass through adhesive. Furthermore, this can suppress resin of the adhesive agent layer 11 from flowing when the protective tape 10 is pasted to the wafer. Setting the shear storage modulus of the adhesive agent layer 11 to 5.0E+04 Pa or less can facilitate bump penetration through the adhesive agent layer 11 and improve electrical conduction.

Examples of resin compositions which may be used in the adhesive agent layer 11 include, without particular limitation, thermosetting types such as anionic thermosetting, cationic thermosetting, and radical thermosetting, and photosetting types such as cationic photosetting and radical photosetting types; these may also be used in combination and it is possible to use a thermosetting/photosetting composition in substantially the same manner.

Herein, as the adhesive agent layer 11, a thermosetting adhesive agent composition containing a film-forming resin, an epoxy resin, a curing agent, and a curing accelerator will be described.

Examples of the film-forming resin include phenoxy resins, epoxy resins, modified epoxy resins, and urethane resins, among others. These film-forming resins may be used individually or in a combination of two or more. Among these, in view of film-formed state and connection reliability properties, among other considerations, a phenoxy resin is preferably used.

Examples of epoxy resin include dicyclopentadiene epoxy resin, glycidyl ether epoxy resin, glycidylamine epoxy resin, bisphenol A epoxy resin, bisphenol F epoxy resin, bisphenol S epoxy resin, spirocyclic epoxy resin, naphthalene epoxy resin, biphenyl epoxy resin, terpene epoxy resin, tetrabromobisphenol A epoxy resin, cresol novolac epoxy resin, phenol novolac epoxy resin, α-naphthol novolac epoxy resin, and brominated phenol novolac type epoxy resin, among others. These epoxy resins may be used individually or in a combination of two or more. Among these, in view of high adhesiveness and heat resistance, a dicyclopentadiene epoxy resin is preferably used.

Examples of curing agents that may be used include novolac phenol resins, aliphatic amines, aromatic amines, and acid anhydrides; these curing agents may be used individually or in a combination of two or more. Among these, in view of crosslink density in a cured product, a novolac phenol resin is preferably used.

Examples of curing accelerators that may be used are imidazoles such as 2-methylimidazole, 2-ethylimidazole, and 2-ethyl-4-methylimidazole, tertiary amines such as 1,8-diazabicyclo[5.4.0]undec-7-ene (DBU), 2-(dimethylaminomethyl)phenol, phosphines such as triphenylphosphine, and metallic compounds such as stannous octoate. Among these, 2-ethyl-4-methylimidazole is preferable.

Furthermore, other constituents such as inorganic fillers, silane coupling agents, elastomers such as acrylic rubber, and pigments such as carbon black may be blended in the adhesive composition as appropriate according to purpose.

Examples of inorganic filler include silica, aluminum nitride, and alumina, among others. These inorganic fillers may be used individually or in a combination of two or more. The inorganic filler is preferably surface-treated and is preferably a hydrophilic inorganic filler. Examples of hydrophilic inorganic fillers include those in which the inorganic filler is surface-treated with a hydrophilic surface treating agent. Examples of hydrophilic surface treatment agents include silane coupling agent, titanate coupling agent, aluminum coupling agent, zircoaluminate coupling agent, $Al_2O_3$, $TiO_2$, $ZrO_2$, silicone, and aluminum stearate, among others; a silane coupling agent is preferably used.

The adhesive agent layer 11 preferably has a thickness of 10 to 80%, and more preferably 10 to 60%, of the height of the bumps formed on the wafer. By selecting a thickness of 10% or more of bump height, bump reinforcement effects are easier to achieve. Moreover, by selecting a thickness of 80% or less of bump height, it is easier for the bumps to penetrate completely through the adhesive agent layer 11. For example, in the case of bumps formed on a wafer having a height of 100 to 200 μm, it is preferable for the adhesive agent layer 11 to have a thickness of 5 to 100 μm and more preferably 5 to 30 μm.

First Thermoplastic Resin Layer 12

Examples of resins used in the first thermoplastic resin layer 12 include ethylene vinyl acetate, polyethylene, polypropylene, polyamide, polyacetal, polyethylene terephthalate, polybutylene terephthalate, fluororesins, polyphenylene sulfide, polystyrene, ABS resin, acrylic resins, polycarbonate, polyurethane, polyvinyl chloride, and polyphenylene oxide, among others. The above resins may be used individually or in a combination of two or more.

The shear storage modulus (Ga) of the first thermoplastic resin layer 12 at 60□ is preferably 1.0E+06 to 1.0E+09 Pa and more preferably 1.0E+06 to 1.0E+07 Pa.

The first thermoplastic resin layer 12 has a thickness (Ta) which is within a range satisfying Formula (1) as given above, and which is preferably 5 to 300 μm and more preferably 5 to 200 μm.

Second Thermoplastic Resin Layer 13

The second thermoplastic resin layer 13 is made from the same resins as described for the first thermoplastic resin layer 12. Constituent resins of the second thermoplastic resin layer may be of a single variety or a combination of two or more varieties.

The shear storage modulus (Gb) of the second thermoplastic resin layer 13 at 60° is preferably 1.0E+04 to 2.0E+06 Pa and more preferably 1.0E+04 to 8.0E+05 Pa.

The second thermoplastic resin layer 13 has thickness (Tb) which is within a range satisfying Formula (1) and which is preferably 100 to 700 µm thick.

Matrix Film Layer 14

Examples of the matrix film layer 14 include plastic films such as those of polyethylene terephthalate, polyethylene, polypropylene, and polyester, as well as porous matrix materials such as paper, cloth, and nonwoven fabric.

The matrix film layer 14 has a thickness of preferably 25 to 200 µm and more preferably 50 to 100 µm.

It should be noted that the protective tape is not limited to the configuration described above, and other layers may be formed on the surface of any layer or between any adjacent layers. For example, the protective tape may include a third thermoplastic resin layer in addition to the first thermoplastic resin layer and second thermoplastic resin layer. In particular, the protective tape may have a third thermoplastic resin layer, differing from the first thermoplastic resin layer and the second thermoplastic resin layer, between the adhesive agent layer and the first thermoplastic resin layer. In this case, a shear storage modulus (Gc) and a thickness (Tc) of the third thermoplastic resin layer at the pasting temperature at which the protective tape is pasted preferably satisfy the conditions expressed by Formulae (1A) and (2A) as given below. By satisfying such conditions, solder bonding properties can be improved, and wafer warping after backgrinding can be reduced.

$$Gc > Ga > Gb \quad (1A)$$

$$Tc < Ta < Tb \quad (2A)$$

In Formula (1A), Gc represents the shear storage modulus of the third thermoplastic resin layer at the pasting temperature at which the protective tape is pasted, Ga and Gb being the same as Ga and Gb in Formula (1). In Formula (2A), Tc represents the thickness of the third thermoplastic resin layer, Ta and Tb being the same as Ta and Tb in Formula (2).

The protective tape according the present embodiment can be formed, for example, by first laminating the matrix film layer, the first thermoplastic resin layer, and the second thermoplastic resin layer to form a matrix film layer/thermoplastic resin layer laminated body which is then laminated to the adhesive agent layer. The matrix film layer/thermoplastic resin layer laminated body can be manufactured by extruding a melted thermoplastic resin onto the base film layer. The adhesive agent layer can be obtained, for example, by preparing the above-described thermosetting adhesive agent composition, applying this to a release-treated base material using a bar coater, and drying.

2. Method for Manufacturing Semiconductor Device

Next, a method for manufacturing a semiconductor device using the aforementioned protective tape will be described. A method for manufacturing a semiconductor device according to the present embodiment includes a protective tape pasting step of pasting a protective tape having an adhesive agent layer to a wafer surface on which a bump is formed, a grinding step of grinding a surface of the wafer opposite to the side on which the protective tape is pasted, and a protective tape peeling step of peeling the protective tape so that the adhesive agent layer remains and other layers are removed, the protective tape being the protective tape described above.

Herein, a curing step of curing an adhesive layer may be performed before any of the grinding step, an adhesive tape pasting step, and a dicing step.

Hereinafter, an example of the method for manufacturing a semiconductor device will be described. This example of the method for manufacturing a semiconductor device uses the protective tape described above and the curing step is performed between the adhesive tape pasting step and the dicing step. Thus, this example of the method for manufacturing a semiconductor device includes a protective tape pasting step (A) of pasting a protective tape having an adhesive agent layer, a grinding step (B), an adhesive tape pasting step (C), a protective tape peeling step (D), a curing step of curing the adhesive agent layer (E), a dicing step (F), an expanding step (G), a picking-up step (H), and a mounting step (I).

(A) Protective Tape Pasting Step

Figure 2:
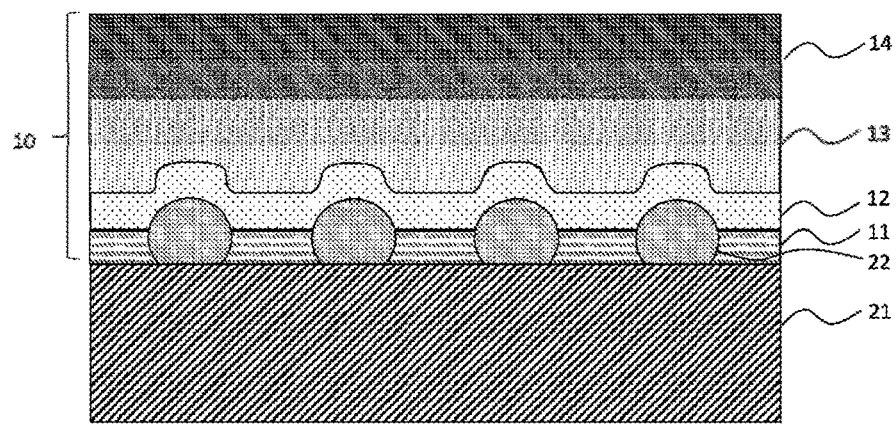
FIG. 2 is a schematic cross-sectional view illustrating a protective tape pasting step.

FIG. 2 is schematic cross-sectional view illustrating a protective tape pasting step. The protective tape pasting step includes pasting a protective tape 10 to a surface of a wafer 21 on which a bump 22 is formed. A pasting temperature at which the protective tape 10 is pasted is preferably 25 to 100° and more preferably 40 to 80° in view of reducing voids, improving tight contact with the wafer, and preventing warping of the wafer after grinding.

The wafer 21 has an integrated circuit formed on a surface of a semiconductor such as silicon and the bump 22 which is for making a connection. Thickness of the wafer 21 is without particular limitation but is preferably 200 to 1000 µm.

Examples of the bump 22 include, without particular limitation, solder-containing low-melting point bumps or high-melting point bumps, tin bumps, silver-tin bumps, silver-tin-copper bumps, gold bumps, and copper bumps, among others. Moreover, height of the bump 22 is, for example, preferably 10 to 200 µm.

The protective tape 10 is pasted in a state in which the formation surface of the bump 22 and the adhesive agent layer 11 are in contact with each other. As illustrated in FIG. 2, the bump 22 penetrates the adhesive agent layer 11 and embeds into the first thermoplastic resin layer 12. Furthermore, the surface of the first thermoplastic resin layer 12 in contact with the second thermoplastic resin 13 is deformed in accordance with the shape of the bump 22. Furthermore, a surface of the second thermoplastic resin layer 13 in contact with the first thermoplastic resin layer 12 is deformed in accordance with the deformation of the first thermoplastic resin layer 12.

(B) Grinding Step

Figure 3:
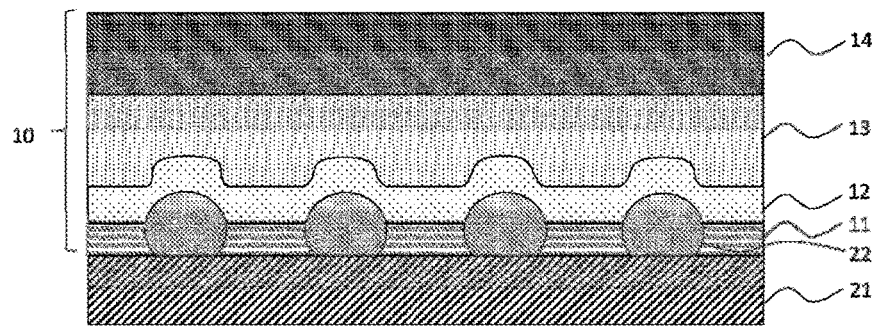
FIG. 3 is a schematic cross-sectional view illustrating a grinding step.

FIG. 3 is a schematic cross-sectional view illustrating a grinding step. The grinding step includes grinding a surface of the wafer 21 opposite to the side on which the protective tape 10 is pasted, thus, the surface opposite to the surface on which the bump 22 is formed is secured to a grinding device and ground. Grinding is typically performed until the wafer 21 has a thickness of 50 to 600 µm; however, in the present embodiment, because the bump 22 is reinforced by the adhesive agent layer 11, the wafer 21 may be ground to a thickness of 50 µm or less.

(C) Adhesive Tape Pasting Step

Figure 4:
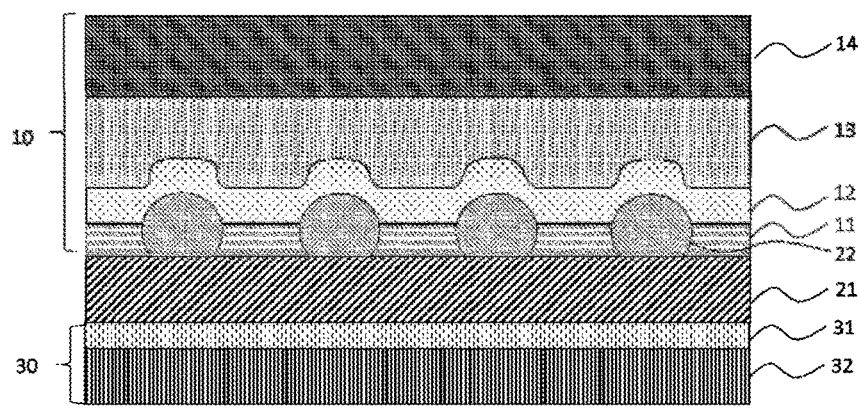
FIG. 4 is a schematic cross-sectional view illustrating an adhesive tape pasting step.

FIG. 4 is a cross-sectional view illustrating an adhesive tape pasting step. The adhesive tape pasting step includes pasting an adhesive tape 30 onto the surface which has been ground. The adhesive tape 30, known as dicing tape, protects and secures the wafer 21 during the dicing step (F) and holds the wafer 21 until the picking-up step (H).

The adhesive tape 30 is without particular limitation and known adhesive tapes may be used. Typically, the adhesive tape 30 includes a pressure-sensitive adhesive agent layer 31 and a matrix film layer 32. Examples of the pressure-sensitive adhesive agent layer 31 include polyethylene-based, acrylic-based, rubber-based, and urethane-based pressure-sensitive adhesives, among others. Moreover, examples of the matrix film layer 32 include plastic films such as those of polyethylene terephthalate, polyethylene, polypropylene, and polyester, as well as porous matrix materials such as those of paper, cloth, and nonwoven fabric. Application devices and conditions for the adhesive tape are without particular limitation and known devices and conditions may be employed.

(D) Protective Tape Peeling Step

Figure 5:
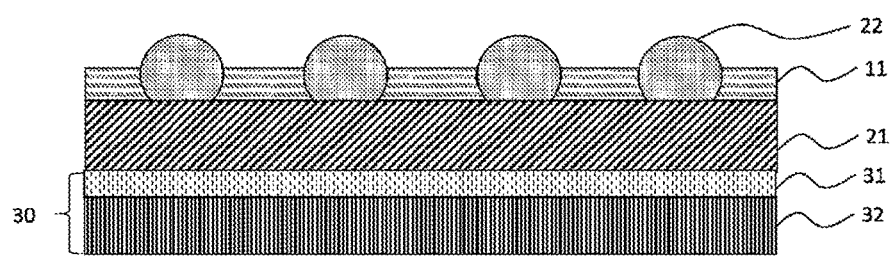
FIG. 5 is a schematic cross-sectional view illustrating a protective tape peeling step.

FIG. 5 is a schematic cross-sectional view illustrating a protective tape peeling step. The protective tape peeling step includes peeling the protective tape 10 so that the adhesive agent layer 11 remains and other layers are removed. Thus, the first thermoplastic resin layer 12, the second thermoplastic resin layer 13, and the matrix film layer 14 are removed and only the adhesive agent layer 11 remains on the wafer 21.

(E) Curing Step

Figure 6:
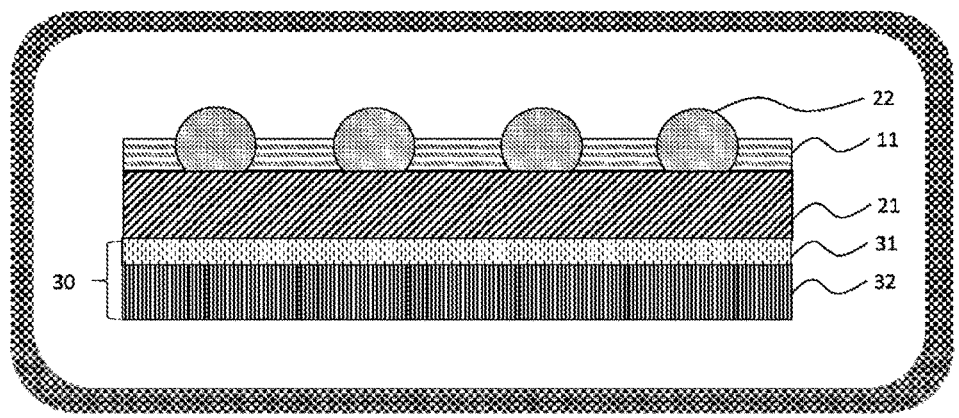
FIG. 6 is a schematic cross-sectional view illustrating a curing step.

FIG. 6 is a schematic cross-sectional view illustrating a curing step. The curing step includes curing the adhesive agent layer 11. Regarding curing methods and curing conditions, known methods for curing thermosetting adhesive agents can be used. For example, preferable curing conditions are 100 to 200□ for one hour.

(F) Dicing Step

Figure 7:
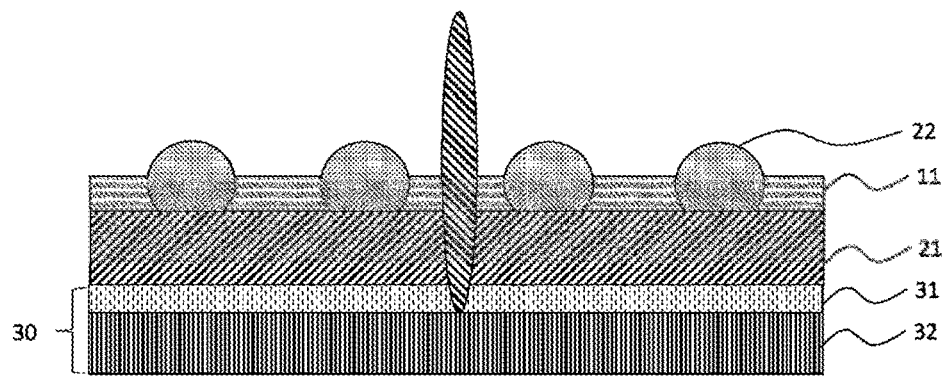
FIG. 7 is a schematic cross-sectional view illustrating a dicing step.

FIG. 7 is a schematic cross-sectional view illustrating a dicing step. The dicing step includes dicing the wafer 21, to which the adhesive tape 30 is pasted, to obtain individual semiconductor chips. The dicing method is without particular limitation, and known methods such as, for example, cutting apart the wafer 21 with a dicing saw may be employed.

Figure 8:
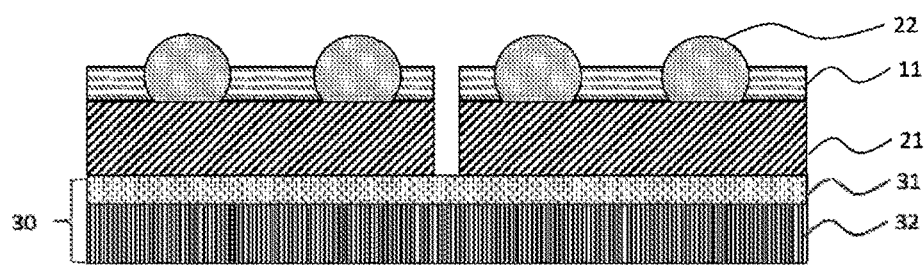
FIG. 8 is a schematic cross-sectional view illustrating an expanding step.

(G) Expanding Step FIG. 8 is a schematic cross-sectional view illustrating an expanding step. The expanding step includes horizontally stretching the adhesive tape 30, on which a plurality of separated individual semiconductor chips are adhered, to increase distances between the individual semiconductor chips.

(H) Picking-Up Step

Figure 9:
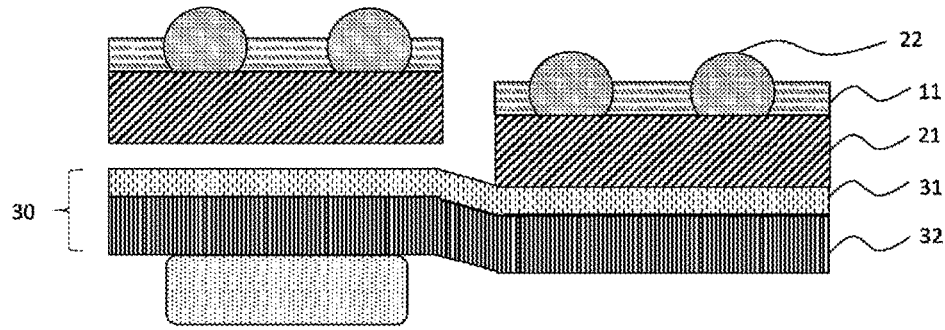
FIG. 9 is a schematic cross-sectional view illustrating a pick-up step.

FIG. 9 is a schematic cross-sectional view illustrating a picking-up step. The picking-up step includes detaching the semiconductor chips from the adhesive tape 30, on which the semiconductor chips are secured by adhesion, by pressing the underside surface of the adhesive tape 30; the detached semiconductor chips are suctioned up by a collet. The picked-up semiconductor chips are collected in a chip tray or are conveyed to a chip-mounting nozzle of a flip-chip bonder.

(I) Mounting Step

Figure 10:
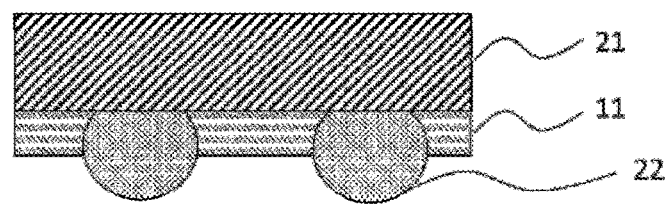
FIG. 10 is a schematic cross-sectional view illustrating a mounting step.

FIG. 10 is a schematic cross-sectional view illustrating a mounting step. The mounting step includes, for example, connecting a semiconductor chip and a circuit substrate using a circuit connecting material such as NCF (Non-Conductive Film). The circuit substrate is without particular limitation and plastic substrates such as polyimide substrates, glass epoxy substrates, and ceramic substrates can be used. Furthermore, as a connection method, known methods such as those using thermal-bonding or reflow ovens can be used.

The method for manufacturing a semiconductor device using the protective tape described above can improve solder bonding properties and reduce wafer warping after backgrinding the wafer. Furthermore, because the bump is reinforced by curing the adhesive agent layer on the wafer surface on which the bump is formed before the dicing step, damage to the bump is reduced in later processes such as dicing, pickup, and mounting. Moreover, a semiconductor device having excellent connection reliability can be obtained with a favorable yield.

A semiconductor device obtained by the method for manufacturing a semiconductor device has a semiconductor chip having a bump and an adhesive agent layer formed on a bump formation surface, and a circuit substrate having an electrode facing the bump; because the adhesive agent layer 11 is formed on the bump formation surface of the semiconductor chip, excellent connection reliability can be obtained.

EXAMPLES

Hereinafter, examples according to the present disclosure will be described. In the present examples, protective tapes were prepared by laminating an adhesive agent layer, a first thermoplastic resin layer, a second thermoplastic resin layer, and a matrix film layer. Using the protective tapes, a protective tape pasting step (A), a grinding step (B), an adhesive tape pasting step (C), a protective tape peeling step (D), a curing step (E), a dicing step (F), an expanding step (G), a picking-up step (H), and a mounting step (I) were performed in that order to prepare semiconductor devices. Then, solder bonding properties and wafer warping in the semiconductor devices were evaluated. It should be noted that the present invention is not limited to these examples.

Shear Storage Modulus

Shear storage moduli of the adhesive agent layers and the thermoplastic resin layers at 60□ were found using a viscoelasticity measuring device. Measurement conditions were a temperature range of 0 to 120□ with a temperature rise of 5□ min, a frequency of 1 Hz, and a deformation of 0.1%.

Protective Tape Preparation

Thermoplastic Resin Layer (Film 1) Preparation

On a PET substrate (thickness 75 μm), the thermoplastic resin layers were extruded so that a first thermoplastic resin layer (any one of the thermoplastic resin layers A1 to A3 listed below), and/or a second thermoplastic resin layer (any one of the thermoplastic resin layers B1 to B3 listed below) were formed in that order.

First Thermoplastic Resin Layer

Thermoplastic resin layer A1: ethylene vinyl acetate copolymer (VF120T, manufactured by UBE-MARUZEN POLYETHYLENE), shear storage modulus at 60□: 3.1E+06 Pa Thermoplastic resin layer A2: (0540F, manufactured by UBE-MARUZEN POLYETHYLENE), shear storage modulus at 60□: 7.1E+06 Pa Thermoplastic resin layer A3: ethylene vinyl acetate copolymer (V319, manufactured by UBE-MARUZEN POLYETHYLENE), shear storage modulus at 60□: 1.1E+06 Pa Second Thermoplastic Resin Layer Thermoplastic resin layer B1: ethylene vinyl acetate copolymer (EV40LX, manufactured by DU PONT-MITSUI POLYCHEMICALS CO., LTD.), shear storage modulus at 60□: 4.9E+05 Pa Thermoplastic resin layer B2: ethylene vinyl acetate copolymer (EV45LX, manufactured by DU PONT-MITSUI POLYCHEMICALS CO., LTD.), shear storage modulus at 60□: 4.2E+04 Pa Thermoplastic resin layer B3: ethylene vinyl acetate copolymer (EV170, manufactured by DU PONT-MITSUI POLYCHEMICALS CO., LTD.), shear storage modulus at 60□: 6.2E+05 Pa Adhesive Agent Layer (Film 2) Preparation As represented in Table 1, adhesive agent layers No. 1 to No. 3 were prepared. For adhesive agent layer No. 1, a resin composition was prepared by blending 13.0 pts. mass of a film-forming resin, 54.8 pts. mass of an epoxy resin, 32.4 pts. mass of a curing agent, and 0.3 pts. mass of a curing accelerator; this was coated to a release treated PET (polyethylene terephthalate) using a bar coater and dried in an oven so as to have an after drying thickness of 30 μm. The adhesive agent layer No. 1 had a shear storage modulus at 60□ of 3.3E+03 Pa.

For adhesive agent layer No. 2, a resin composition was prepared by blending 13.0 pts. mass of a film-forming resin, 54.8 pts. mass of an epoxy resin, 32.4 pts. mass of a curing agent, 0.3 pts. mass of a curing accelerator, and 25.0 pts. mass of a filler; this was coated to a release treated PET (polyethylene terephthalate) using a bar coater and dried in an oven so as to have an after drying thickness of 30 μm. The adhesive agent layer No. 2 had a shear storage modulus at 60□ of 3.6E+04 Pa.

For adhesive agent layer No. 3, a resin composition was prepared by blending 2.0 pts. mass of a film-forming resin, 54.8 pts. mass of an epoxy resin, 32.4 pts. mass of a curing agent, and 0.3 pts. mass of a curing accelerator; this was coated to a release treated PET (polyethylene terephthalate) using a bar coater and dried in an oven so as to have an after drying thickness of 30 μm. The adhesive agent layer No. 3 had a shear storage modulus at 60□ of 3.6E+01 Pa.

TABLE 1

| | | adhesive agent layer | | |
|---|---|---|---|---|
| | product name | No. 1 | No. 2 | No. 3 |
| film-forming resin | PKHH | 13.0 | 13.0 | 2.0 |
| epoxy resin | HP7200H | 54.8 | 54.8 | 54.8 |
| curing agent | TD-2093 | 32.4 | 32.4 | 32.4 |
| curing accelerator | imidazole (2E4MZ) | 0.3 | 0.3 | 0.3 |
| filler | Aerosil RY200 | — | 25.0 | — |
| total | | 100.0 | 125.0 | 100.0 |
| filler (wt %) | | — | 20.0 | — |
| shear storage modulus at 60 ° C. (Pa) | | 3.3E+03 | 3.6E+04 | 3.6E+01 |

Film-forming resin: phenoxy resin (PKHH, manufactured by Union Carbide Corporation)

Epoxy resin: dicyclopentadiene epoxy resin (HP7200H, manufactured by DIC Corporation)

Curing agent: novolac phenol resin (TD-2093, manufactured by DIC Corporation)

Curing accelerator: 2-ethyl-4-methylimidazole (2E4MZ)

Filler: silica (Aerosil RY 200, Nippon Aerosil Co., Ltd.)

Example 1

A protective tape was prepared by laminating the thermoplastic resin layers (film 1) and the adhesive agent layer (film 2) described above. As the film 1, a film consisting of a PET matrix (75 μm), the thermoplastic resin layer A1 (50 μm), and the thermoplastic resin layer B1 (450 μm) was used. As the film 2, the adhesive agent layer No. 1 (20 μm) was used.

Example 2

Other than that, as the film 1, a film consisting of a PET matrix (75 μm), the thermoplastic resin layer A2 (50 μm), and the thermoplastic resin layer B1 (450 μm) was used, and, as the film 2, the adhesive agent layer No. 2 (20 μm) was used, a protective tape was prepared as in Example 1.

Example 3

Other than that, as the film 1, a film consisting of a PET matrix (75 μm), the thermoplastic resin layer A3 (50 μm), and the thermoplastic resin layer B1 (450 μm) was used, and, as the film 2, the adhesive agent layer No. 3 (20 μm) was used, a protective tape was prepared as in Example 1.

Example 4

Other than that, as the film 1, a film consisting of a PET matrix (75 μm), the thermoplastic resin layer A1 (50 μm), and the thermoplastic resin layer B2 (450 μm) was used, and, as the film 2, the adhesive agent layer No. 1 (20 μm) was used, a protective tape was prepared as in Example 1.

Example 5

Other than that, as the film 1, a film consisting of a PET matrix (75 μm), the thermoplastic resin layer A1 (50 μm), and the thermoplastic resin layer B3 (450 μm) was used, and, as the film 2, the adhesive agent layer No. 1 (20 μm) was used, a protective tape was prepared as in Example 1.

Example 6

Other than that, as the film 1, a film consisting of a PET matrix (75 μm), the thermoplastic resin layer A1 (20 μm), and the thermoplastic resin layer B1 (450 μm) was used, and, as the film 2, the adhesive agent layer No. 1 (20 μm) was used, a protective tape was prepared as in Example 1.

Example 7

Other than that, as the film 1, a film consisting of a PET matrix (75 μm), the thermoplastic resin layer A1 (200 μm), and the thermoplastic resin layer B1 (450 μm) was used, and, as the film 2, the adhesive agent layer No. 1 (20 μm) was used, a protective tape was prepared as in Example 1.

Example 8

Other than that, as the film 1, a film consisting of a PET matrix (75 μm), the thermoplastic resin layer A1 (50 μm), and the thermoplastic resin layer B1 (300 μm) was used, and, as the film 2, the adhesive agent layer No. 1 (20 μm) was used, a protective tape was prepared as in Example 1.

Example 9

Other than that, as the film 1, a film consisting of a PET matrix (75 μm), the thermoplastic resin layer A1 (50 μm), and the thermoplastic resin layer B1 (600 μm) was used, and, as the film 2, the adhesive agent layer No. 1 (20 μm) was used, a protective tape was prepared as in Example 1.

Example 10

Other than that, as the film 1, a film consisting of a PET matrix (50 μm), the thermoplastic resin layer A1 (50 μm), and the thermoplastic resin layer B1 (450 μm) was used, and, as the film 2, the adhesive agent layer No. 1 (20 μm) was used, a protective tape was prepared as in Example 1.

Example 11

Other than that, as the film 1, a film consisting of a PET matrix (100 μm), the thermoplastic resin layer A1 (50 μm), and the thermoplastic resin layer B1 (450 μm) was used, and, as the film 2, the adhesive agent layer No. 1 (20 μm) was used, a protective tape was prepared as in Example 1.

Example 12

Other than that, as the film 1, a film consisting of a PET matrix (75 μm), the thermoplastic resin layer A1 (5 μm), and the thermoplastic resin layer B1 (495 μm) was used, and, as the film 2, the adhesive agent layer No. 1 (20 μm) was used, a protective tape was prepared as in Example 1.

Example 13

Other than that, as the film 1, a film consisting of a PET matrix (75 μm), the thermoplastic resin layer A1 (50 μm), and the thermoplastic resin layer B1 (450 μm) was used, and, as the film 2, the adhesive agent layer No. 2 (20 μm) was used, a protective tape was prepared as in Example 1.

Example 14

Other than that, as the film 1, a film consisting of a PET matrix (75 μm), the thermoplastic resin layer A1 (250 μm), and the thermoplastic resin layer B1 (450 μm) was used, and, as the film 2, the adhesive agent layer No. 1 (20 μm) was used, a protective tape was prepared as in Example 1.

Comparative Example 1

Other than that, as the film 1, a film consisting of a PET matrix (75 μm) and the thermoplastic resin layer B1 (500 μm) was used, and, as the film 2, the adhesive agent layer No. 1 (20 μm) was used, a protective tape was prepared as in Example 1.

Comparative Example 2

Other than that, as the film 1, a film consisting of a PET matrix (75 μm) and the thermoplastic resin layer A1 (500 μm) was used, and, as the film 2, the adhesive agent layer No. 1 (20 μm) was used, a protective tape was prepared as in Example 1.

Semiconductor Device Preparation

The adhesive agent layer surfaces of the protective tapes were pasted and laminated at 60☐ with a vacuum laminator onto wafers (size: 5 cm×5 cm×700 μmt) on which solder bumps (φ=250 μm, H=200 μm itch=250 μm) were formed.

Next, a grinder (DFG8560 manufactured by DISCO Corporation) was used to backgrind to a wafer thickness of 300 Subsequently, the protective tape was peeled so that the adhesive agent layers remained and other layers (PET matrix and thermoplastic resin layers) were removed before curing the adhesive agent layers on the wafers in an oven at 130☐ for two hours. The wafers were then diced and the chips were separated before being mounted with a mounting device to substrates (gold electrodes with flux) and solder bonded with a reflow oven at a maximum temperature of 260☐

Solder Bonding Properties Evaluation

Areas over which the solder had wet and spread were measured against a reference value of 100% representing area for the bump size after applying flux onto the gold electrodes of the substrates and solder bonding with reflow at a maximum temperature of 260☐. Solder bonding properties were evaluated as good when the solder wet and spread over an area of 40% or more, and not good when less than 40%, with respect to the area for the bump size. Results from Examples and Comparative Examples are represented in Tables 2 and 3 below.

Wafer Warping Evaluation

The adhesive agent layer surfaces of the protective tapes were pasted to eight-inch wafers (thickness: 725 μm) and wafer warping was measured when backgrinding to a wafer thickness of 300 μm. Wafer warping was evaluated as small when warping was 5 mm or less and large when wafer warping exceeded 5 mm. Results from Examples and Comparative Examples are represented in Tables 2 and 3 below.

TABLE 2

| | | Ex. 1 | Ex. 2 | Ex. 3 | Ex. 4 | Ex. 5 | Ex. 6 | Ex. 7 |
|---|---|---|---|---|---|---|---|---|
| | adhesive agent layer | No. 1 | No. 2 | No. 3 | No. 1 | No. 1 | No. 1 | No. 1 |
| | first thermoplastic resin layer | A1 | A2 | A3 | A1 | A1 | A1 | A1 |
| | second thermoplastic resin layer | B1 | B1 | B1 | B2 | B3 | B1 | B1 |
| | matrix film layer | PET | PET | PET | PET | PET | PET | PET |
| shear storage modulus at 60° C. (Pa) | adhesive agent layer ($G_n$) | 3.3E+03 | 3.6E+04 | 3.6E+01 | 3.3E+03 | 3.3E+03 | 3.3E+03 | 3.3E+03 |
| | first thermoplastic resin layer ($G_a$) | 3.1E+06 | 7.1E+06 | 1.1E+06 | 3.1E+06 | 3.1E+06 | 3.1E+06 | 3.1E+06 |
| | second thermoplastic resin layer ($G_b$) | 4.9E+05 | 4.9E+05 | 4.9E+05 | 4.2E+04 | 6.2E+05 | 4.9E+05 | 4.9E+05 |
| thickness (μm) | adhesive agent layer($T_n$) | 20 | 20 | 20 | 20 | 20 | 20 | 20 |
| | first thermoplastic resin layer ($T_a$) | 50 | 50 | 50 | 50 | 50 | 20 | 200 |
| | second thermoplastic resin layer ($T_b$) | 450 | 450 | 450 | 450 | 450 | 450 | 450 |
| | matrix film layer | 75 | 75 | 75 | 75 | 75 | 75 | 75 |
| | shear storage modulus ratio ($G_n/G_a$) | 1.1E−03 | 5.0E−03 | 3.4E−05 | 1.1E−03 | 1.1E−03 | 1.1E−03 | 1.1E−03 |
| | corrected elastic modulus ($G_a*T_a + G_b*T_b$)/($T_a + T_b$) | 7.5E+05 | 1.2E+06 | 5.5E+05 | 3.5E+05 | 8.7E+05 | 6.0E+05 | 1.3E+06 |
| | solder bonding properties (%) | 105 | 90 | 110 | 100 | 110 | 100 | 110 |
| | wafer warping (mm) | 2 | 3 | 1.5 | 1.5 | 3 | 1.5 | 4 |

TABLE 3

|  |  | Ex. 8 | Ex. 9 | Ex. 10 | Ex. 11 | Ex. 12 | Ex. 13 | Ex. 14 | Comp. 1 | Comp. 2 |
|---|---|---|---|---|---|---|---|---|---|---|
|  | adhesive agent layer | No. 1 | No. 1 | No. 1 | No. 1 | No. 1 | No. 2 | No. 1 | No. 1 | No. 1 |
|  | first thermoplastic resin layer | A1 | A1 | A1 | A1 | A1 | A1 | A1 | — | A1 |
|  | second thermoplastic resin layer | B1 | B1 | B1 | B1 | B1 | B1 | B1 | B1 | — |
|  | matrix film layer | PET | PET | PET | PET | PET | PET | PET | PET | PET |
| shear storage modulus at 60° C. (Pa) | adhesive agent layer (Gn) | 3.3E+03 | 3.3E+03 | 3.3E+03 | 3.3E+03 | 3.3E+03 | 3.6E+04 | 3.3E+03 | 3.3E+03 | 3.3E+03 |
|  | first thermoplastic resin layer (Ga) | 3.1E+06 | 3.1E+06 | 3.1E+06 | 3.1E+06 | 3.1E+06 | 3.1E+06 | 3.1E+06 | — | 3.1E+06 |
|  | second thermoplastic resin layer (Gb) | 4.9E+05 | 4.9E+05 | 4.9E+05 | 4.9E+05 | 4.9E+05 | 1.2E+06 | 4.9E+05 | 4.9E+05 | — |
| thickness (μm) | adhesive agent layer (Tn) | 20 | 20 | 20 | 20 | 20 | 20 | 20 | 20 | 20 |
|  | first thermoplastic resin layer (Ta) | 50 | 50 | 50 | 50 | 5 | 50 | 250 | — | 500 |
|  | second thermoplastic resin layer (Tb) | 300 | 600 | 450 | 450 | 495 | 450 | 450 | 500 | — |
|  | matrix film layer | 75 | 75 | 50 | 100 | 75 | 75 | 75 | 75 | 75 |
|  | shear storage modulus ratio (Gn/Ga) | 1.1E−03 | 1.1E−03 | 1.1E−03 | 1.1E−03 | 1.1E−03 | 1.2E−02 | 1.1E−03 | 6.7E−03 | 1.1E−03 |
|  | corrected elastic modulus (Ga*Ta + Gb*Tb)/(Ta + Tb) | 8.6E+05 | 6.9E+05 | 7.5E+05 | 7.5E+05 | 5.2E+05 | 1.4E+06 | 1.4E+06 | 4.9E+05 | 3.1E+06 |
|  | solder bonding properties (%) | 105 | 105 | 105 | 105 | 100 | 40 | 110 | 15 | 110 |
|  | wafer warping (mm) | 2.2 | 2.5 | 2 | 2 | 1.3 | 2 | 5 | 1 | 7 |

As in Examples 1 to 14, for protective tapes having, in the following order, the adhesive agent layer (adhesive agent layers No. 1 to No. 3), the first thermoplastic resin layer (thermoplastic resin layers A1 to A3), the second thermoplastic resin layer (thermoplastic resin layers B1 to B3), and the matrix film layer (PET matrix), and satisfying the conditions of Formulae (1) to (3) given above, it was found that solder bonding properties were good and wafer warping was small.

In particular, as in Examples 1 to 12 and Example 14, in addition to satisfying the conditions of Formulae (1) to (3) given above, when the protective tapes satisfied the condition of Formula (4) given above, it was found that solder bonding properties were further improved.

As in Comparative Example 1, in the case of using a protective tape without the first thermoplastic resin layer, it was found that solder bonding properties were not good. In this regard, because the protective tape had only the relatively soft second thermoplastic resin layer (thermoplastic resin layer B1) and lacked the first thermoplastic resin layer which is relatively hard in comparison with the second thermoplastic resin layer, the likelihood of the second thermoplastic resin layer adhering to bumps is considered to have been increased.

As in Comparative Example 2, in the case of using a protective tape without the second thermoplastic resin layer and exceeding the condition of Formula (3) as given above, that is, when the corrected elastic modulus exceeds 1.4E+06 Pa, it was found that wafer warping was large. In this regard, because the protective tape had only the relatively hard first thermoplastic resin layer and lacked the second thermoplastic resin layer which is softer than the first thermoplastic resin layer, the likelihood of wafer warping occurring when backgrinding the wafer is considered to have been increased.

REFERENCE SIGNS LIST

10 protective tape, 11 adhesive agent layer, 12 first thermoplastic resin layer, 13 second thermoplastic resin layer, 14 matrix film layer, 21 wafer, 22 bump, 30 adhesive tape, 31 pressure-sensitive adhesive agent layer, 32 matrix film layer

The invention claimed is:

1. A protective tape comprising, in the following order, an adhesive agent layer, a first thermoplastic resin layer, a second thermoplastic resin layer, and a matrix film layer, wherein conditions expressed by the following formulae (1) to (3) are satisfied, $$Ga > Gb \tag{1}$$

$$Ta < Tb \tag{2}$$

$$(Ga*Ta + Gb*Tb)/(Ta+Tb) \leq 1.4E+06 \text{ Pa} \tag{3}$$

wherein, in formula (1), Ga represents a shear storage modulus of the first thermoplastic resin layer at a pasting temperature at which the protective tape is pasted and Gb represents a shear storage modulus of the second thermoplastic resin layer at the pasting temperature at which the protective tape is pasted, in formula (2), Ta represents a thickness of the first thermoplastic resin layer and Tb represents a thickness of the second thermoplastic resin layer, in formula (3), Ga and Gb are the same as in formula (1) and Ta and Tb are the same as in formula (2).

2. The protective tape according to claim 1, wherein a condition expressed by the following formula (4) is satisfied, $$Gn/Ga \leq 0.01 \tag{4}$$

wherein, in formula (4), Gn represents a shear storage modulus of the adhesive agent layer at the pasting temperature at which the protective tape is pasted and Ga is the same as in formula (1).

3. The protective tape according to claim 1, wherein the pasting temperature is 40 to 80° C.

4. The protective tape according to claim 1, wherein shear storage modulus of the first thermoplastic resin layer at 60° C. is 1.0E+0.6 to 1.0E+09 Pa, and wherein shear storage modulus of the second thermoplastic resin layer at 60° C. is 1.0E+04 to 2.0E+06 Pa.

5. The protective tape according to claim 1,
wherein shear storage modulus of the adhesive agent layer at 60° C. is 1.0E+01 to 5.0E+04 Pa.

6. The protective tape according to claim 1, wherein the adhesive agent layer is pasted to a wafer surface on which a bump is formed, wherein a thickness of the adhesive agent layer, the thickness of the first thermoplastic resin layer, and the thickness of the second thermoplastic resin layer, in total, exceed a height of the bump.

7. The protective tape according to claim 6, wherein the thickness of the adhesive agent layer is 10 to 80% of the height of the bump.

8. A method for manufacturing a semiconductor device comprising:

a protective tape pasting step of pasting a protective tape having an adhesive agent layer to a wafer surface on which a bump is formed;

a grinding step of grinding a surface of the wafer opposite to the side on which the protective tape is pasted; and a protective tape peeling step of peeling the protective tape so that the adhesive agent layer remains and other layers are removed, wherein the protective tape comprises, in the following order, the adhesive agent layer, a first thermoplastic resin layer, a second thermoplastic resin layer, and a matrix film layer, wherein conditions expressed by the following formulae (1) to (3) are satisfied, $$Ga > Gb \quad (1)$$

$$Ta < Tb \quad (2)$$

$$(Ga*Ta + Gb*Tb)/(Ta+Tb) \leq 1.4\text{E}+06 \text{ Pa} \quad (3)$$

wherein, in formula (1), Ga represents a shear storage modulus of the first thermoplastic resin layer at a pasting temperature at which the protective tape is pasted and Gb represents a shear storage modulus of the second thermoplastic resin layer at the pasting temperature at which the protective tape is pasted, in formula (2), Ta represents a thickness of the first thermoplastic resin layer and Tb represents a thickness of the second thermoplastic resin layer, in formula (3), Ga and Gb are the same as in formula (1) and Ta and Tb are the same as in formula (2).

9. The method for manufacturing a semiconductor device according to claim 8, further comprising:

an adhesive tape pasting step of pasting an adhesive tape to a ground surface;

a dicing step of dicing the wafer to which the adhesive tape is pasted to obtain individual semiconductor chips; and a curing step of curing the adhesive agent layer, wherein the curing step is performed before the dicing step.

10. A semiconductor device manufactured by the method for manufacturing a semiconductor device according to claim 8.

11. The protective tape according to claim 2, wherein shear storage modulus of the first thermoplastic resin layer at 60° C. is 1.0E+0.6 to 1.0E+09 Pa, and wherein shear storage modulus of the second thermoplastic resin layer at 60° C. is 1.0E+04 to 2.0E+06 Pa.

12. The protective tape according to claim 3, wherein shear storage modulus of the first thermoplastic resin layer at 60° C. is 1.0E+0.6 to 1.0E+09 Pa, and wherein shear storage modulus of the second thermoplastic resin layer at 60° C. is 1.0E+04 to 2.0E+06 Pa.

13. The protective tape according to claim 2, wherein shear storage modulus of the adhesive agent layer at 60° C. is 1.0E+01 to 5.0E+04 Pa.

14. The protective tape according to claim 3, wherein shear storage modulus of the adhesive agent layer at 60° C. is 1.0E+01 to 5.0E+04 Pa.

15. The protective tape according to claim 4, wherein shear storage modulus of the adhesive agent layer at 60° C. is 1.0E+01 to 5.0E+04 Pa.

16. The protective tape according to claim 2, wherein the adhesive agent layer is pasted to a wafer surface on which a bump is formed, wherein a thickness of the adhesive agent layer, the thickness of the first thermoplastic resin layer, and the thickness of the second thermoplastic resin layer, in total, exceed a height of the bump.

17. The protective tape according to claim 3, wherein the adhesive agent layer is pasted to a wafer surface on which a bump is formed, wherein a thickness of the adhesive agent layer, the thickness of the first thermoplastic resin layer, and the thickness of the second thermoplastic resin layer, in total, exceed a height of the bump.

18. The protective tape according to claim 4, wherein the adhesive agent layer is pasted to a wafer surface on which a bump is formed, wherein a thickness of the adhesive agent layer, the thickness of the first thermoplastic resin layer, and the thickness of the second thermoplastic resin layer, in total, exceed a height of the bump.

19. The protective tape according to claim 5, wherein the adhesive agent layer is pasted to a wafer surface on which a bump is formed, wherein a thickness of the adhesive agent layer, the thickness of the first thermoplastic resin layer, and the thickness of the second thermoplastic resin layer, in total, exceed a height of the bump.

20. A semiconductor device manufactured by the method for manufacturing a semiconductor device according to claim 9.

* * * * *

UNITED STATES PATENT AND TRADEMARK OFFICE
CERTIFICATE OF CORRECTION

PATENT NO. : 10,312,125 B2  
APPLICATION NO. : 15/574729  
DATED : June 4, 2019  
INVENTOR(S) : Hironobu Moriyama et al.

Page 1 of 1

It is certified that error appears in the above-identified patent and that said Letters Patent is hereby corrected as shown below:

In the Specification

Column 5, Line 30, change "60☐" to --60° C--;
Column 6, Line 56, change "60☐" to --60° C--;
Column 7, Line 2, change "60☐" to --60° C--;
Column 8, Line 24, change "100☐" to --100° C--; change "80☐" to --80° C--;
Column 9, Line 30, change "200☐" to --200° C--;
Column 10, Line 36, change "60☐" to --60° C--;
    Line 38, change "120☐" to --120° C--;
    Line 39, change "5☐" to --5° C--;
    Line 53, change "60☐" to --60° C--;
    Line 57, change "60☐" to --60° C--;
    Line 60, change "60☐" to --60° C--;
    Line 66, change "60☐" to --60° C--;
Column 11, Line 4, change "60☐" to --60° C--;
    Line 8, change "60☐" to --60° C--;
    Line 19, change "60☐" to --60° C--;
    Line 28, change "60☐" to --60° C--;
    Line 36, change "60☐" to --60° C--;
Column 14, Line 14, change "60☐" to --60° C--;
    Line 22, change "130☐" to --130° C--;
    Line 27, change "260☐" to --260° C--; and
    Line 33, change "260☐" to --260° C--.

Signed and Sealed this  
Third Day of September, 2019

Andrei Iancu  
*Director of the United States Patent and Trademark Office*